United States Patent [19]

Gregg

[11] Patent Number: 4,964,934

[45] Date of Patent: Oct. 23, 1990

[54] OPTICAL DISK MANUFACTURING PROCESS

[75] Inventor: David P. Gregg, Culver City, Calif.

[73] Assignee: Del Mar Avionics, Irvine, Calif.

[21] Appl. No.: 305,109

[22] Filed: Feb. 2, 1989

[51] Int. Cl.$^5$ ............................................. B32B 31/00
[52] U.S. Cl. .................................... 156/219; 156/253; 156/270; 156/281; 156/302; 156/312; 156/390; 346/135.1; 346/137; 350/320; 427/252; 428/64
[58] Field of Search ............... 156/312, 270, 302, 253, 156/281, 219, 390; 427/252; 350/320; 346/137, 135.1; 428/64

[56] References Cited

U.S. PATENT DOCUMENTS

| | | | |
|---|---|---|---|
| 4,334,233 | 6/1982 | Murakami | 346/135.1 |
| 4,397,923 | 8/1983 | Yasuda et al. | 346/135.1 |
| 4,752,554 | 6/1988 | Sato et al. | 346/135.1 |

*Primary Examiner*—John J. Gallagher
*Attorney, Agent, or Firm*—W. Douglas English

[57] ABSTRACT

A process for manufacture of a second surface optically recordable disk is disclosed. A reflective sheet of aluminum, flow process produced by precipitation of a layer of aluminum from gasified triisobutyl aluminum onto a layer of molten indium, is mated with a polymer substratum sheet. In completion of the process, an optically active layer which is applied over the reflective layer is embossed with an optically transparent polycarbonate, protective cover, the mating surface of which, may be, pregrooved and coded with data relative to address and sector codes. Covers with bonded laminae are then successively severed from the lamina sheet to yield independent second surface optically recordable media.

12 Claims, 3 Drawing Sheets

OPTICAL DISK MANUFACTURING PROCESS

BACKGROUND OF THE INVENTION

1. Field of the Invention:

The invention relates to a method for the manufacture of a second surface optical recording storage disk, card or device.

2. Description of the Prior Art:

Existing optical disk or card art relating to write once-read many (WORM), magneto-optical (erasable) type or similar optical recording devices generally consist of a laminated or multilayered structure having a rigid support substrate, a reflective layer, a photosensitive optically reactive second surface layer which is, depending upon disk or card application, covered by a first surface optically transparent protective coating layer.

Historically each said layer has been subsequently superimposed intermittently upon the preceding layer on a disk by disk basis, by various succeeding methods such as injection or compression molding, spin coating, sputtering, vacuum deposition, and, in general, by means of individual layer by layer lamination techniques. Each substrate is processed to receive succeeding such lamination coatings individually, serially or in batches of small numbers.

More recent trends in optical recording technology have led to development of first surface optically recordable laminations which have been conveniently and efficiently manufactured in relatively wide webs of great length and width. By such means, optical recording laminations may likewise be manufactured in an efficient and economical manner. However, although such first surface optical recording laminations may be cut into circular or rectangular sheets as well as traditional lengthy tapes, the relatively thin, first surface optically recordable disks or cards produced in such manner have significant disadvantages when compared to earlier second surface optical recording structures. In spite of a thin protective coating over the first surface optical recordable layer of such laminated sheets, randomly attracted dust particles of but a micron or so in diameter, not visible to the unaided eye, may lodge very close to the first surface optically reactive layer, thereby blocking out significant areas of the optically reactive layer causing commensurate dropouts of data to be recorded or reproduced and thereby causing subsequent loss of information.

In addition, the relatively thin laminate sheet structure of optical disks cut from an optical laminate sheet has no rigid structural component and therefore has a tendency to bend and curl. Therefore, it is necessary that such laminate optical recording disks be spun immediately above a flat stationary surface at a speed above a critical minimum which flattens the disk to optical record or reproduce requirements by formation of an air bearing film; generally referred to as the Bernoulli technique.

In view of the foregoing prior art limitations there exists a longstanding and continuing need for a new and improved process for mass production of optical recording disks or cards having the rigid, second surface optical attributes of a thick and transparent substrate and therefore a surface which will hold dust and mechanical defects at a safe distance from the plane of a focussed record or reproduce beam on the recordable layer, yet also having the economical manufacturing advantages of a first surface optical lamination of large sheets of an optical recording medium.

The invention disclosed herein does just that by combining the technical advantages of a second surface optical medium together with the manufacturing simplicity and efficiency of a first surface optical recording medium.

SUMMARY OF THE INVENTION

The invention disclosed herein provides a method of fabrication of second surface optical recording disks or cards by combining attributes of two existing optical recording media, i.e. first surface optically recordable laminal and second surface optically recordable disks.

The invention conceives a continuous process for applying an optically transparent cover, conventionally molded in disk shape or other desired shape, with or without preset data, encoded information relating to address and sector codes, or tracking grooves as desired, to an assembly line produced first surface optical recording lamination conventionally having a composite structure of a pliant web support substratum, a reflective lamina, and an optically reactive lamina. The cover component is compressed and embossed into the first surface optically recordable (reactive) lamination component to bond and seal permanently the two components and thereby yield a second surface optical recording medium. The newly formed second surface optical recording structure is then die cut from the composite lamination sheet to yield an independent second surface optical recording medium that is, in essence, manufactured in a simple and efficient flow process as opposed to the conventional multistep process of manufacturing a second surface optical recording disk by starting with a disk substrate and then successively adding each desired layer, i.e. reflective layer, protective layer, etc., on a disk by disk basis.

OBJECT OF THE INVENTION

It is therefore a primary object of the invention to provide an improved efficient and cost-saving method for mass production of second surface optical recording media by combining and utilizing portions of two distinct and independent existing methods of manufacturing first surface optical recording lamination sheets or tapes with second surface optical recording disks or cards.

Other objectives, features, benefits, and advantages of the disclosed invention will become more readily apparent upon reading the following detailed description of the preferred embodiment in view of the accompanying drawing and appended claims.

DETAILED DESCRIPTION OF A PREFERRED EMBODIMENT

Figure 1:
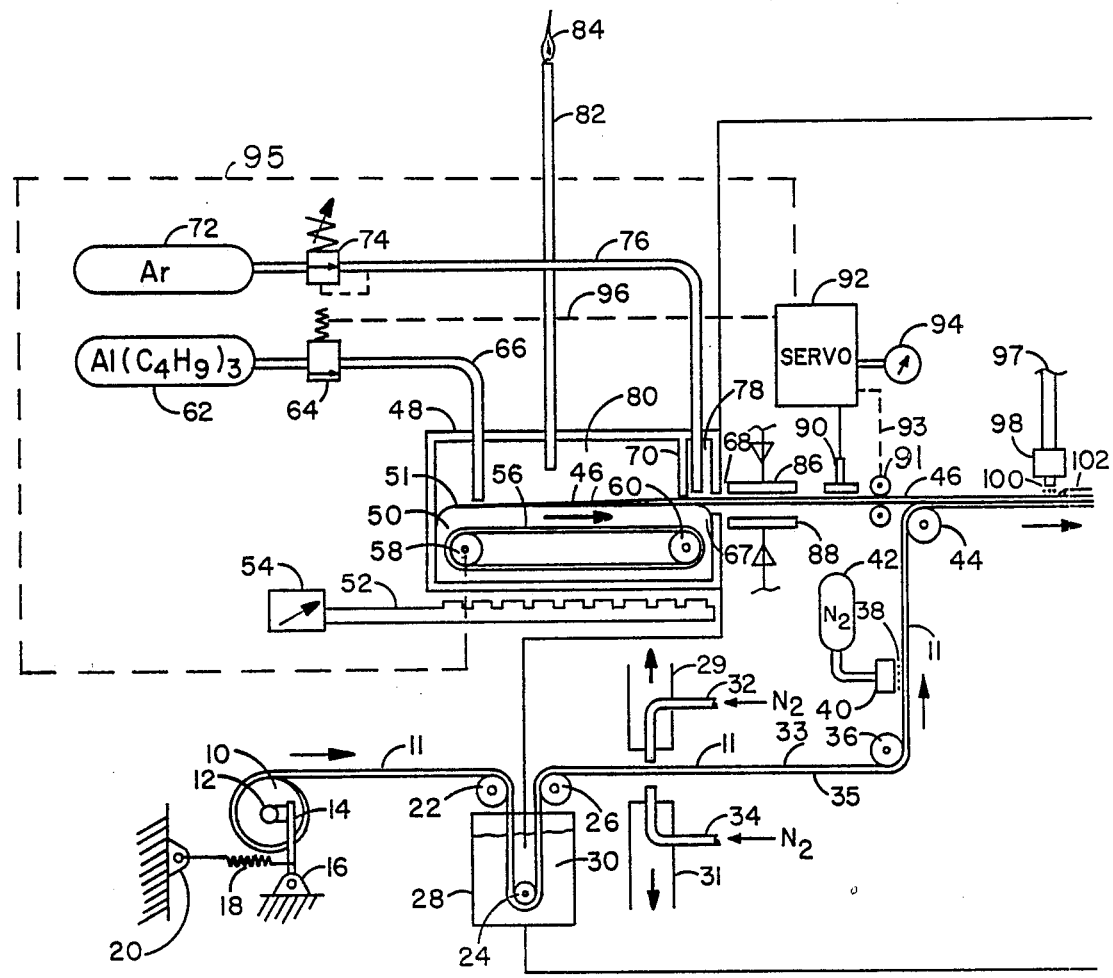
FIG. 1 illustrates an overall view of the manufacturing process to produce second surface optically recordable disks.
Figure 1:
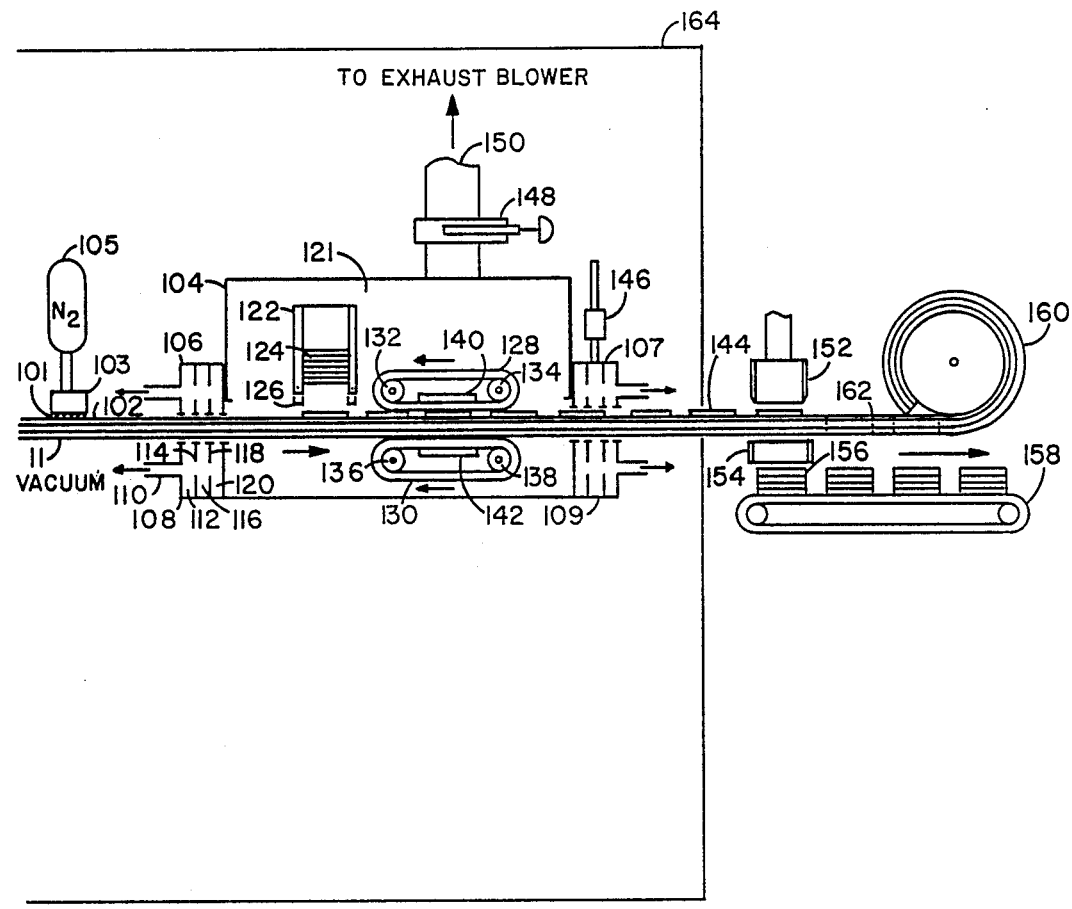

The invention method for manufacture of second surface optically recordable media is, in large part, illustrated in FIG. 1. The flow diagram of FIG. 1 illustrates an overall view of the process and system claimed herein. It should be understood that various lamina, layers, described in the system of FIG. 1 are not drawn to relative scale with respect to each other, but are all drawn with equal thickness for clarity of illustration.

In FIG. 1, a roll 10 of a web substratum 11 consists of a commercially available film forming material, such as polyethylene terephthalate (PET) in the preferred embodiment, but may likewise be any other material of high elastic modulus. Roll 10 is mounted on a shaft 12 which is rotatably coupled to and supported by a lever arm 14. Lever arm 14 is pivotally fixed at pivot point 16 and is acted upon by a constant spring force ($F = -Kx$) from a restraining spring 18 which is fixedly secured by a stationary support 20. The force of kinetic friction ($f_s$) of shaft 12 in combination with said restraining spring maintains a constant tautness of substratum 11, at the supplying end thereof.

Substratum 11 is pulled off roll 10, and passed over first, second and third rollers 22, 24 and 26, respectively, through a tank 28 containing a cleaning fluid solution 30, and through a superior and inferior blowdry blasters, 32 and 34 respectively, to a fourth roller 36. Cleaning solution 30 may be any commercially available cleaning detergent having characteristics that can efficiently remove dust particles, oil films and other undesirable contaminants, yet is sufficiently diluted and nonabrasive so as to not alter the very smooth polymer surface of substratum 11. In the embodiment disclosed herein, substratum 11 need not have the additional characteristic of great optical smoothness. It is sufficient that it be strong enough in tensile strength merely to serve as a pliant support structure for superimposition thereon of succeeding laminal, to function as the nonrecordable side of an optically recordable lamination and to provide a degree of protection as well.

Substrate 11 may normally be 25 $\mu$m ($10^{-6}$m) in thickness and of indefinite length and width as is necessary to accommodate production of a large number of second surface optically recordable disks, cards or other desirable formats.

Upon passing through cleaning solution 30, substratum 11 is blasted upon both surfaces thereof, i.e. a mating surface 33 and an external surface 35, with room temperature, dry, nitrogen gas ($N_2$) having a fluid flow rate of at least one liter per second per square decimeter ($1/S/dm^2$) of surface area. Nitrogen gas upon passing through blasters 32 and 34 is vented via a superior and an inferior exhaust vents, 29 and 31 respectively. Upon being blown dry by blaster 32, mating surface 33 of substratum 11 receives a first adhesive lamina 38 deposited by a first adhesive dispenser/sprayer 40 operated upon by a first pressurized gas source 42. Having a uniform first adhesive lamina 38 on mating surface 33, substratum 11, is passed over a fourth roller 44 before being mated and bonded to a reflective lamina 46.

Reflective lamina 46, having reflectivity characteristics of at least 80%, is an aluminum lamina in the preferred embodiment of approximately 25 $\mu$m in thickness but may also be any reflective metal, organo-metallic compound or alloy. Reflective lamina 46 is derived in the preferred embodiment from the precipitation of pure aluminum (Al) from a gas of triisobutyl aluminum, Al ($C_4H_9$)$_3$, herein after referred to as TIBA, flowing upon a body of molten indium (In) or other liquid whose density is greater than aluminum and whose temperature is sufficient to precipitate aluminum out of TIBA.

The principles and one typical application of the aluminum deposition process are described in a publication of the Office of Technical Services of the U.S. Department of Commerce, June 1959, titled, "Development of a Method to Accomplish Aluminum Deposition by Gas Plating."

In one version of the preferred embodiment a partially sealed enclosure 48 contains therein a body of molten indium 50. Indium 50 is maintained in the molten state by application of heat thereto of approximately 270° C., by means of an electrical heating element 52, regulated by a heat regulator 54. Immersed in liquid indium 50, is a dual sprocket ladder chain drive 56, of augmented width driven by regulated first and second sprocket wheels 58 and 60. Chain drive 56 may be of any necessary width to accommodate a similar aluminum lamina width output to approximate the desired width of substratum 11.

A TIBA source 62, gasified and regulated by a TIBA regulator 64, feeds TIBA gas or said gas mixed with a carrier gas such as argon, into chamber 48, and directs the TIBA, or mixture, to flow upon molten indium 50 surface 51 by a TIBA feed pipe 66. As the TIBA contacts the hot surface 51, of molten indium 50, aluminum metal is precipitated from the decomposition of the gas upon surface 51. Since aluminum is lighter than indium, the aluminum congeals upon surface 51. Rotary action of chain drive 56 sets up a similar linear flow of liquid indium 50. Liquid indium surface 51, therefore, tends to flow in the direction of the indicated arrow carrying along with it the accumulating layer of aluminum metal. As the aluminum web, reflective layer 46, builds up, it is expected to reach approximately 25 $\mu$m in thickness when it reaches liquid indium miniscus 67, and an exit slot 68.

To prevent TIBA, or the TIBA-Ar mixture, from escaping enclosure 48, a baffle 70 is configured immediately preceeding exit slot 68. A source of an inert gas, argon (Ar) gas, 72, flow of which is regulated by regulated by regulator 74, passes via an inert gas feed pipe 76, into a baffle enclosure volume 78. The greater pressure of argon gas in baffle enclosure volume 78, in comparison to gas enclosed in a volume 80 of enclosure 48, and in comparison to exit slot 68, tends to both keep TIBA within volume 80, and also keep outside contaminantes from entering enclosure 48. As the aluminum is drawn out of the TIBA-Ar mixture both methene gas ($C_4H_8$), and hydrogen gas ($H_2$), are created according to the following catalyzed process:

$$2Al(C_4H_9)_3 \rightarrow 2Al + 3H_2 + 6C_4H_8.$$

The argon, ethene and hydrogen are vented from enclosure 48, via an exit pipe 82 and flared to harmless compounds ($CO_2$ and $H_2O$) at a distal end thereof 84.

Aluminum web, reflective lamina 46 thusly created exists enclosure 48 by automatically separating from indium meniscus 67 at exit slot 68. On exiting therefrom, reflective lamina 46 is first supported by a superior and inferior air bearings 86 and 88 respectively, conventional to the art. Along the edges of reflective lamina 46, but outside the useful central zone thereof, are lamina speed and tensioning means 91, conventional in the art, operating in closed-loop servo means 93, of thickness sensor 90. Thickness sensor 90, may be any conventional x-ray or dielectric type sensor having the capacity to monitor and assure that a consistent and desired thickness of aluminum reflective lamina is maintained. To do so, a thickness servo 92, having a thickness adjusting mechanism 94, is coupled via dashed line 96 to TIBA mixture regulator 64. If more aluminum is needed to yield a thicker aluminum reflective lamina 46, then regulator 64 is opened more to allow a greater flow of TIBA mixture into volume 80 of enclosure 48.

Figure 2A:
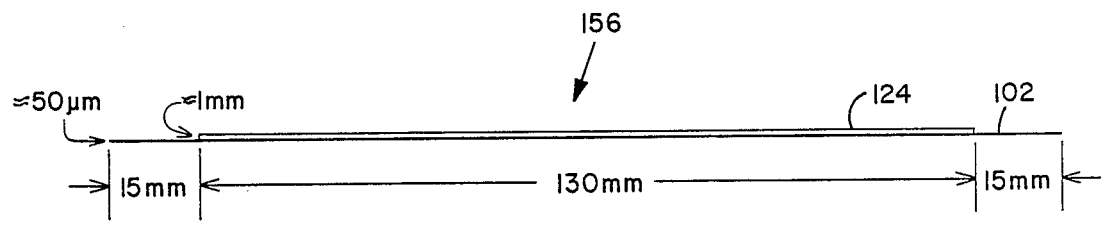
FIG. 2a illustrates a sideview of the second surface optically recordable disk on severance from the composite lamination sheet.
Figure 2B:
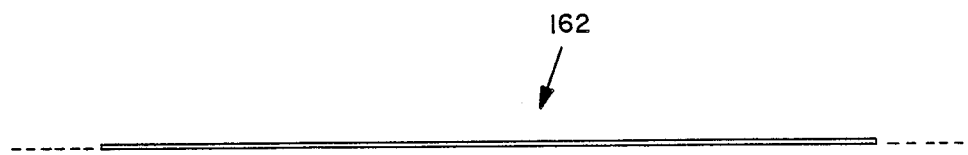
FIG. 2b illustrates the completed optical disk with trimmed and sealed edge/periphery.

As described above, a composite lamina 102, comprising substratum 11, reflective lamina 46, and reactive lamina 100, as well as, covers 124, have been grossly distorted in relative thickness in FIG. 1 for purpose of illustration of the overall invention flow process. FIGS. 2a & 2b provide, however, a clearer view of the relative dimension and a proper perspective of the semi-finished and finished product. In FIG. 2a, a 130 mm ($10^{-3}$ m) cover 124, having a 15 mm extended composite lamina 102 lip, is subjected to a very exacting cutting and sealing process, conventional in the art. Faying surface of cover 124 is conventionally sealed with any of various thermoplastic or thermosetting resins, widely varying in flexibility, used in tough chemical-resistive coatings and adhesives, e.q. polyurethane, to yield the finished 130 mm, second surface optically recordable disk, illustrated in FIG. 2b.

On passing over fourth roller 44, aluminum, reflective lamina 46 is mated with adhesive surface 38 of substratum 11. Once reflective lamina 46 and substratum 11 have fused, the combination is pulled under a dye polymer dispenser 98 where a lamina of optically reactive dye polymer 100 is sprayed uniformly across the surface of reflective lamina 46 to complete a process of forming a first layer optically reactive (recordable) laminate sheet. Optically reactive lamina 100, which is generally in the realm of 100 nm in thickness, is a soluble dye polymer or dye-binder polymer blend, and is illustrated as being sprayed onto reflective lamina 46, in a finely atomized spray; however, lamina 100, may likewise be applied by rolling or dipping techniques, conventional to the art. Following application of optically active lamina 100, a second adhesive lamina 101 is applied by a finely atomized spray of a second adhesive dispenser 103, operated upon by a second pressurized gas source 105. However, it is understood that the functions of dye polymer and adhesive may be combined by use of a similar substance having both characteristics, i.e. an adhesive dye polymer.

The thusly formed first surface optically recordable composite lamina 102, comprising optically active lamina 100, reflective lamina 46, and substratum 11, is next passed through a partially evacuated cover placement and embossing compartment 104. On entering compartment 104, composite lamina 102, first passes through a superior and an inferior stationary triple compartment entrance gland seals, 106 and 108 respectively. Entrance gland seals 106 and 108 and exit gland seals 107 and 109, operated to create a partial vacuum within compartment 104. Referring to gland seal 108, but applicable to all other gland seals, an outlet 110 is coupled to a vacuum pump creating a partial vacuum in first gland compartment 112. A first gland partition 114, having a small passage therethrough, allows for a creation of a greater vacuum in second gland compartment 116. Similarly, a second gland partition 118, having a small passageway therethrough, allows for creation of an even greater vacuum in third gland compartment 120, which leads to creation of a better vacuum in interior 121 of compressing compartment 104.

A cover storage and dispensing device 122, positioned within compressing compartment 104, retains a stock of disk shaped covers 124 that are retained and dropped one at a time at regulated intervals by tripping means 126. Covers 124 may be in the preferred embodiment 120, 130 or 200 mm in diameter and approximately 1 mm in thickness. Covers 124, may be injection or compression molded, optical grade polycarbonate or polymethylmethacrylate (PMMA) of low birefringence with tracking grooves and limited address and definitive data encoded and molded therein. It is desirable, however, that the optical material comprising disk covers 124, be treated for low transmittance of UV energy in order that protective cover 124, once mated with optically recordable composite lamina 102, will not transmit damaging light energy that would decompose the dye polymer comprising the optically active layer of the recordable medium when subjected to an environment of harmful Ultraviolet (UV) radiation.

As composite lamina 102 flows along at a constant rate in the direction indicated, disk dispenser 122 systematically drops individual covers 124, on second adhesive lamina 101. Composite lamina 102, with cover 124, is then compressed for permanent bonding and embossing between a superior and an inferior conveyor belts 128 and 130, respectively, driven by regulated drive wheels 132, 134, 136 and 138. A superior and an inferior back plates, 140 and 142 respectively, are fixedly positioned behind conveyor belts 128 and 130, respectively, to guide and maintain position of belts 128 and 130, as they compress and emboss covers 124, into adhesive lamina 101, and into optically active lamina 100, of composite lamina 102.

Adding covers 124 to composite lamina 102, converts the first surface optically recordable composite lamina 102, into second surface optically recordable media 144. The second surface optically recordable media 144 exit embossing enclosure 104 through exit gland seals 107 and 109. Although all other gland seals, 106, 108 and 109 are stationary, superior exit gland seal 107, is provided with lifting means 146 to temporarily lift seal 107, as the newly formed second surface optically recordable media 144 exit enclosure 104.

When gland seal 107 lifts to allow media 144 to exit enclosure 104, the partial vacuum in enclosure 104 is, of course, temporarily lost. Therefore, a slide valve 148 is provided in the intake side of an exhaust blower 150, such that as gland seal 107 is lifted slightly, slide valve 148 is closed. As gland seal 107 is returned to its seat, slide valve 148 is opened allowing exhaust blower 150 to evacuate enclosure 104 once more.

Composite lamina 102 with newly formed second surface optically recordable media 144 embossed therein now passes through a superior and inferior die cutting means 152 and 154, respectively. Cutting means 152 and 154 are basically cylindrical punches in the preferred embodiment but may, of course, be any desired geometrical shape to make a variety of uniquely shaped recordable media for particular applications. Superior punch 152 is designed to be the same shape and diameter as covers 124.

Punches 152 and 154 function in such manner that as covers 124 and respective embossed portion of composite lamina 102 are severed from composite lamina 102, the embossed lamina portion of the individual second surface optically recordable disk 156 thereby formed extends as a lip around the periphery of respective covers 124, attached thereto. Diameter of composite lamina 102 should be approximately 23% greater than diameter of respective cover.

Once the second surface recordable medium 144 is cut from composite lamina 102, medium 144 is thereby converted into a second surface recordable disk 156, and is dropped to a finishing conveyor belt 158. Composite lamina 102, with holes 162, punched therethrough is collected by a tension regulated collection roller 160 for disposal. It should be noted that, although the foregoing process ideally may be conducted totally within a clean room enviroment, it is contemplated in the present disclosure that the invention process could be implemented in a less than clean room setting. As illustrated by an overall process enclosure 164, the majority of the foregoing process is confined to a semi-cleanroom enviroment, i.e., higher air pressure in side enclosure 164, than outside thereof.

As is customary, although a particular embodiment of the invention has been illustrated and described, it is understood that obvious modifications and alterations of components thereto, within the ambit of the disclosure, and claims directed thereto, are anticipated. It is intended, therefore, that the following claims be interpreted to cover all such modifications which fall within the spirit and scope of the invention.

What is claimed is:

1. A laminating flow process for manufacture of second surface optically recordable media, comprising the steps of:
    providing a continuous flow of substratum;
    covering said substratum with a first adhesive lamina;
    applying a continuous flow of an optically reflective lamina to said first adhesive lamina;
    covering said reflective lamina with an optically active lamina to form a first surface optically recordable composite lamina;
    covering said active lamina with an optically transparent, second adhesive lamina;
    sequentially applying molded, optically transparent, ultra violet inhibiting covers to said second adhesive lamina to form a second surface optically recordable lamina, comprising multiple second surface optically recordable media;
    compressing and embossing each said cover into said active lamina; and
    severing said multiple second surface optically recordable media from said composite lamina to form individual second surface otpically recordable media.

2. A laminating flow process according to claim 1, wherein said substratum is a polymer lamina.

3. A laminating flow process according to claim 1, wherein said reflective lamina may be any organo metallic combination having a reflectivity characteristic of at least 80%.

4. A laminating flow process according to claim 3, wherein said reflective lamina is aluminum.

5. A laminating flow process according to claim 4, wherein said aluminum is extracted from a flow of gasified triisobutyl aluminum and argon and is precipatated upon a flowing liquid surface to form a moving aluminum lamina web thereon.

6. A laminating flow process according to claim 5, wherein said liquid is molten indium.

7. A laminating flow process according to claim 1, wherein said optically active lamina is a dye polymer having characteristics of being optically transparent to all wavelengths of electromagnetic energy yet opaque to the ultra violet spectrum.

8. A laminating flow process according to claim 1, wherein said active lamina and said second adhesive lamina are combined as a composite single lamina which is applied in a single step.

9. A laminating flow process according to claim 1, wherein said covers are injection molded, optical grade polymer disks having characteristics of low birefringence.

10. A laminating flow process according to claim 9, wherein said covers are molded with tracking grooves.

11. A laminating flow process according to claim 10, wherein said grooved covers are encoded with information and data.

12. Laminating flow apparatus for manufacture of second surface optically recordable media, comprising:
    means for providing a continuous flow of a substratum lamina having a mating side and an external side;
    means for providing a continuous flow of an optically reflective lamina;
    means, coupling said substratum lamina to said reflective lamina, for continuously and uniformly bonding and uniting said reflective lamina with said mating side of said substratum lamina;
    means, coupled to said uniting means, for uniformly covering said reflective lamina with an optically active lamina to form a first surface optically recordable composite lamina;
    means, coupled to said optically active covering means, for sequentially bonding and embossing individual optically transparent ultra violet inhibiting covers to said first surface optically recordable composite lamina to form multiple second surface optically recordable media; and
    means, coupled to said embossing means, for sequentially severing said second surface optically recordable media to form individual second surface optically recordable media.

* * * * *